United States Patent
Arguelles et al.

(10) Patent No.: US 10,444,744 B1
(45) Date of Patent: Oct. 15, 2019

(54) DECOUPLED LOAD GENERATION ARCHITECTURE

(75) Inventors: Carlos A. Arguelles, Shoreline, WA (US); Siamak Irantash, Bothell, WA (US)

(73) Assignee: Amazon Technologies, Inc., Reno, NV (US)

( * ) Notice: Subject to any disclaimer, the term of this patent is extended or adjusted under 35 U.S.C. 154(b) by 506 days.

(21) Appl. No.: 13/016,303

(22) Filed: Jan. 28, 2011

(51) Int. Cl.
*G01D 3/00* (2006.01)
*G01P 21/00* (2006.01)
*G06F 11/00* (2006.01)
*G05B 23/02* (2006.01)
*G01R 31/28* (2006.01)

(52) U.S. Cl.
CPC ......... *G05B 23/02* (2013.01); *G01R 31/2834* (2013.01)

(58) Field of Classification Search
CPC .............................. G05B 23/02; G01R 31/2834
USPC .................................................. 702/108, 188
See application file for complete search history.

(56) References Cited

U.S. PATENT DOCUMENTS

| | | | | |
|---|---|---|---|---|
| 5,623,498 A * | 4/1997 | Pannone | ............ | G06F 11/3672 375/224 |
| 6,853,943 B1 * | 2/2005 | Neumann | ............... | H04L 43/50 702/119 |
| 7,133,805 B1 * | 11/2006 | Dankenbring et al. | ....... | 702/186 |
| 7,412,623 B1 * | 8/2008 | Lindberg | ............ | G06F 11/3414 714/33 |
| 9,122,789 B1 * | 9/2015 | Massa | ................. | G06F 11/3612 |
| 2002/0073374 A1 * | 6/2002 | Danialy | ........... | G01R 31/31724 714/738 |
| 2002/0177977 A1 * | 11/2002 | Scarlat et al. | ................ | 702/186 |
| 2003/0074606 A1 * | 4/2003 | Boker | ................. | G06F 11/3495 714/42 |
| 2005/0182589 A1 * | 8/2005 | Smocha et al. | ................ | 702/121 |
| 2009/0271152 A1 * | 10/2009 | Barrett | ................ | G06F 11/3409 702/186 |
| 2010/0131590 A1 * | 5/2010 | Coleman et al. | ............. | 709/203 |
| 2010/0287474 A1 * | 11/2010 | Feng et al. | ..................... | 715/716 |
| 2010/0319002 A1 * | 12/2010 | Gosain et al. | ................ | 719/311 |
| 2012/0053879 A1 * | 3/2012 | Chang et al. | ................. | 702/104 |

FOREIGN PATENT DOCUMENTS

WO   WO 2009/011061   *   1/2009

OTHER PUBLICATIONS

Definition of Server, Online Dictionary, printed Apr. 25, 2015.*

* cited by examiner

*Primary Examiner* — Michael P Nghiem
(74) *Attorney, Agent, or Firm* — Robert C. Kowert; Meyertons, Hood, Kivlin, Kowert & Goetzel, P.C.

(57) ABSTRACT

Techniques, including systems and methods, for testing systems utilize a decoupled architecture. A device for administering a test on a system is decoupled from one or more other devices that apply a load on the system as part of the test. The one or more devices that apply the load on the system and the system itself may be located in a common facility. The one or more devices that apply the load on the system may apply the load in a manner specific to one or more applications executing on the system.

27 Claims, 5 Drawing Sheets

DECOUPLED LOAD GENERATION ARCHITECTURE

BACKGROUND

It is often desirable to have an understanding how a system performs (or ceases to perform) under a load where one or more of the system's resources is taxed in some manner. One way of doing this is to measure the number of transactions per second the system can process and/or the number of concurrent connections that can be provided for a certain period of time without exceeding a predefined target latency or returning a certain percentage of error messages. Engineers often devise various one-time load generator solutions to address their problem space at a high cost.

Conventional methods of testing a system are not ideal for a number of reasons. Various efforts of one engineer often overlap with other one-time efforts of another engineer. Further, different engineers often desire to compose tests using different languages, such as Java, C++, and Ruby, increasing the complexity of interfacing with a load generator. In addition, a machine used for testing may not have enough hardware resources (memory, processor, disk space, etc) to handle applying a load, especially if the system being tested is designed to handle large loads. By testing with a machine that does not have enough resources, test results may be skewed by the resource needs for load generation. Sometimes the main purpose of a test is to obtain results of the load itself, but other times, users may wish to know the outcome of a specific client scenario when the server is under a desired background load (in which case the load is "background noise" versus the main subject of the test). In such instances, developers may devise a multi-threaded solution where some of the threads are applying the load and some of the threads are applying the test. As another example of a problem, a test machine may be in a geographically different location from the server, and latency introduced by this distance may affect the latency results to make them unrealistic. If the user wishes to put load on a system from different internet protocol (IP) addresses (for example in a case where the requests are being throttled by IP address), deployment can be significantly more difficult. Also, if two tests are inadvertently run simultaneously, the system being tested may be under two separate test loads, possibly rendering the test results invalid. Avoidance of this may be difficult to detect whether one test is already being run at a particular time.

DETAILED DESCRIPTION

Figure 1:
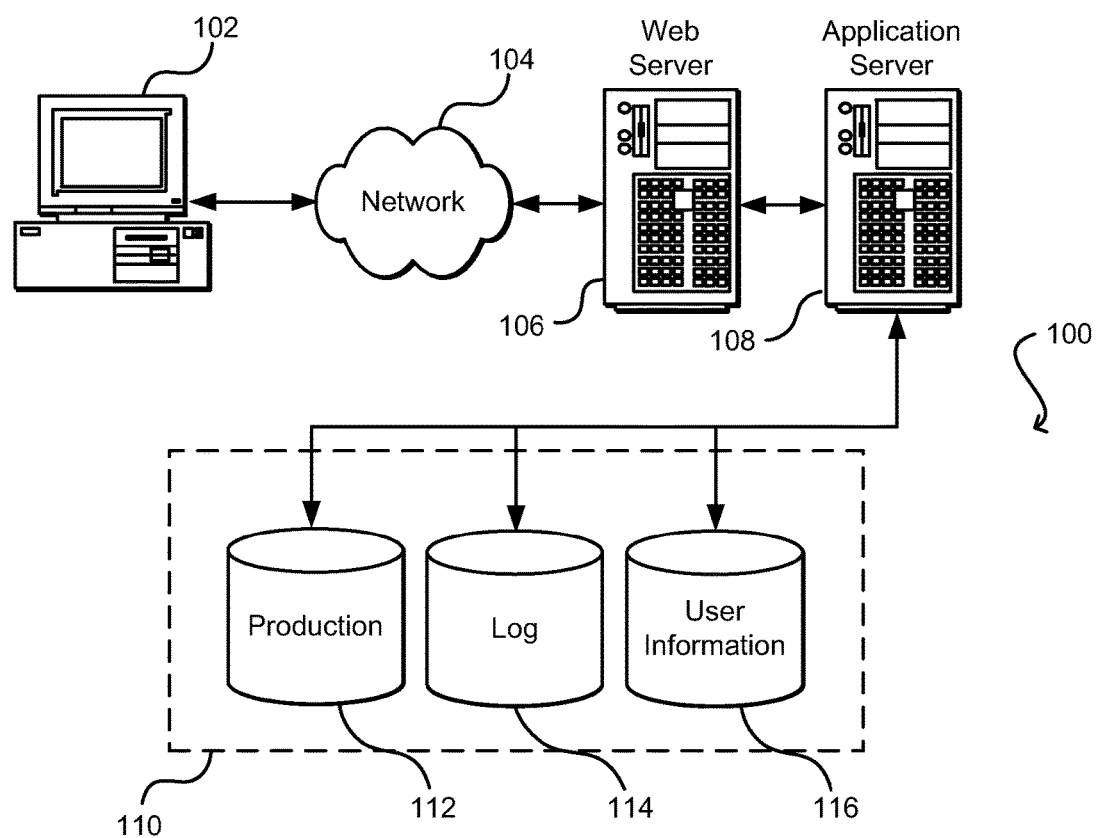
FIG. 1 illustrates an environment in which various embodiments can be implemented.

Techniques described and suggested herein include systems and methods for testing various types of system. In particular, various embodiments of the present disclosure relate to using resources used to apply a load on a system that are separate from resources used to test the system. In various embodiments, a multi-tiered architecture may be utilized which allows such utilization of resources while providing the flexibility for developing and/or customizing tests for various systems while avoiding adverse effects on the validity of test results present in conventional techniques. One or more tiers of the architecture may utilize generic interfaces to facilitate test development and/or administration for a wide variety of systems.

In an embodiment, a system comprises one or more computing devices. The devices of the system may include one or more servers that are operable to receive and respond to requests. The one or more servers may perform additional actions, including, but not limited to, computations, accessing data storage, accessing services that are separate from the system, and the like. To test the system, a load is applied to the system. A load may include any actions, such as communication with the system, that cause the system to utilize one or more system resources (processor(s), data storage, communications devices, and the like). Instructions for applying the load may be provided from a testing device (e.g., a test administration device) that is separate from one or more devices that apply the load. The testing device, for example, may be a device that utilizes its own computing resources that are separate from computing resources used by the one or more devices used to apply the load. Instructions for applying the load may specify a number of transactions in a time period or a number of concurrent connections to be made between the system and the one or more devices used to apply the load on the system. Other parameters may include parameters for gradually increasing and/or decreasing and/or otherwise varying a load and may include parameters that are specific to an application executing on the system. In this manner, computing resources of one or more devices administering a test on the system are separate from computing resources of one or more devices that apply a load on the system as part of the test. Therefore, undesirable effects on the accuracy of tests due to resources used to applying a load not being able to measure effects of applying the load are minimized.

One or more devices involved in applying a load on the system may be located in various geographic locations. For example, one or more devices that apply the load on the system may be located in one or more locations that are geographically remote from the system or located in geographical proximity to the system, such as in the same facility in which the system is located. The facility may be, for example, a data center. One or more devices that apply a load on the system may also be geographically proximate to the system while one or more other devices that apply a load on the system may be geographically remote from the system. Locating one or more devices that apply a load on the system in geographic proximity to the system, may minimize latency and other issues resulting from remotely locating the one or more devices from the system. A testing device may also be located in various locations, such as remote from the facility, in the facility, or outside of the facility but in geographical proximity to the facility. In addition, embodiments of the present disclosure provide, in various embodiments, users the ability remotely and effectively test systems of the organization without needing to test the systems from the facilities in which the systems are located. However, various embodiments also provide the flexibility to administer tests from within the facilities in which the systems are located.

Various embodiments of the present disclosure utilize a three-tiered architecture that includes a test tier, a generic load generator tier, and an application-specific load generator tier. The test tier, in an embodiment, includes computing resources used for providing instructions to perform a test on a system. The generic load-generating tier, in an embodiment, includes a load generator servlet that is operable to receive instructions from one or more devices of the test tier and communicate with one or more load drivers in the application specific generator tier. A load driver, in an embodiment, is an application that is operable to receive instructions from the load generator servlet and cause an application in a system under test to perform an action according to the instructions. The load driver may be in the same or in a different device than the load generator servlet.

In an embodiment, the load generator servlet is configured with a generic interface that allows tests on systems to be defined in generic terms, such as a number of transactions per second and a number of concurrent connections. The load generator servlet may also be configured to send generic instructions (according to the instructions received from the test machine) to one or more load drivers of the application-specific load generator tier. The one or more load drivers may translate these instructions into application-specific instructions and send the application-specific instructions to a system for execution. Communication between the various tiers may be performed in a generic manner, thereby allowing development of tests and of load drivers to be performed in a programming language-agnostic manner. For instance, a test machine may communicate with a load generator servlet by making representational state transfer (RESTful) calls to the load generator servlet, thereby allowing tests to be developed using any programming language that provides the capability of making RESTful calls. Other features, variations, and advantages to the present disclosure are described below.

FIG. 1 illustrates an example of an environment 100 for implementing aspects in accordance with various embodiments. As will be appreciated, although a Web-based environment is used for purposes of explanation, different environments may be used, as appropriate, to implement various embodiments. The environment includes an electronic client device 102, which can include any appropriate device operable to send and receive requests, messages, or information over an appropriate network 104 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections, and combinations thereof. In this example, the network includes the Internet, as the environment includes a Web server 106 for receiving requests and serving content in response thereto, although for other networks an alternative device serving a similar purpose could be used as would be apparent to one of ordinary skill in the art.

The illustrative environment includes at least one application server 108 and a data store 110. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store, and is able to generate content such as text, graphics, audio, and/or video to be transferred to the user, which may be served to the user by the Web server in the form of HTML, XML, or another appropriate structured language in this example. The handling of all requests and responses, as well as the delivery of content between the client device 102 and the application server 108, can be handled by the Web server. It should be understood that the Web and application servers are not required and are merely example components, as structured code discussed herein can be executed on any appropriate device or host machine as discussed elsewhere herein.

The data store 110 can include several separate data tables, databases, or other data storage mechanisms and media for storing data relating to a particular aspect. For example, the data store illustrated includes mechanisms for storing production data 112 and user information 116, which can be used to serve content for the production side. The data store also is shown to include a mechanism for storing log data 114, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 110. The data store 110 is operable, through logic associated therewith, to receive instructions from the application server 108 and obtain, update, or otherwise process data in response thereto. In one example, a user might submit a search request for a certain type of item. In this case, the data store might access the user information to verify the identity of the user, and can access the catalog detail information to obtain information about items of that type. The information then can be returned to the user, such as in a results listing on a Web page that the user is able to view via a browser on the user device 102. Information for a particular item of interest can be viewed in a dedicated page or window of the browser.

Each server typically will include an operating system that provides executable program instructions for the general administration and operation of that server, and typically will include a computer-readable medium storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 1. Thus, the depiction of the system 100 in FIG. 1 should be taken as being illustrative in nature, and not limiting to the scope of the disclosure.

The various embodiments further can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIPS, and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer-readable media for containing code, or portions of code, can include any appropriate media known or used in the art, including storage media and communication media, such as but not limited to volatile and non-volatile, removable and non-removable media implemented in any method or technology for storage and/or transmission of information such as computer-readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Figure 2:
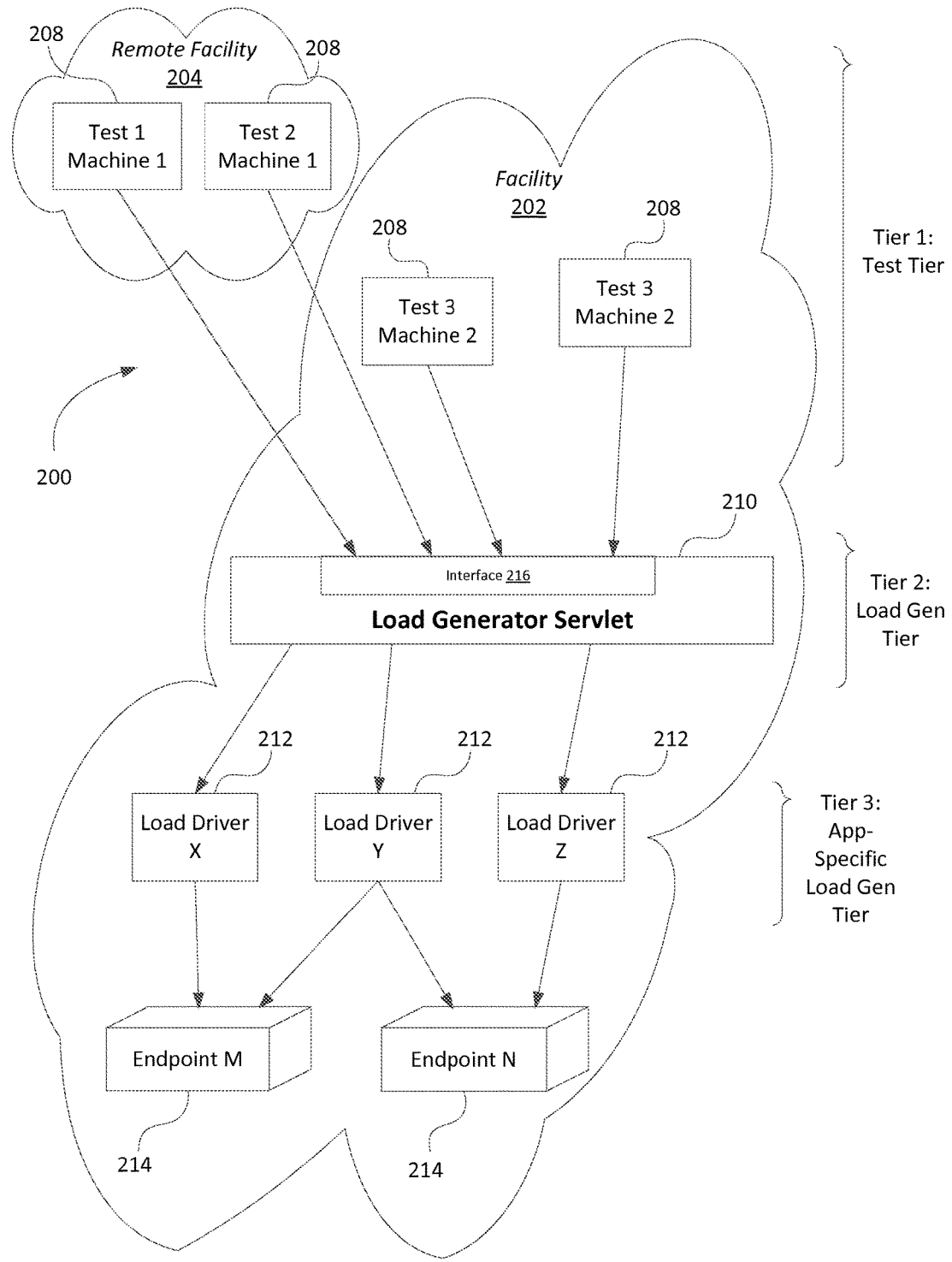
FIG. 2 illustrates an environment which may utilize various components and configurations described in connection with FIG. 1.

FIG. 2 demonstrates an illustrative example of an environment 200 in which various embodiments described above in connection with FIG. 1 may be used, although other configurations are contemplated as being within the spirit of the present disclosure. As described in detail below, embodiments of the present disclosure employ a three-tiered modularized standard architecture. In the illustrative example shown in FIG. 2, the environment 200 includes a facility 202 and a remote facility 204. The facility 202, in an embodiment, is any facility or combination of facilities in which a system comprising one or more computing devices, as described below, are located. As an example, the facility 202 may be a data center that includes a network of computing devices. The facility may include various computing resources utilized in connection with the computing devices, such as resources mentioned above. A network of computing devices may be a network utilizing components of the environment described above in connection with FIG. 1, or variations thereof.

The remote facility 204 may be any facility that includes one or more computing devices that are operable to communicate with one or more of the computing devices in the facility 202. Computing devices in the remote facility 204 may, for example, be utilized by an organization to remotely control, operate, configure, and otherwise access computing devices in the facility 204. Further, the remote facility 204 may be located in a geographic location different from the facility 202. A communications network, such as the Internet, may be utilized for communication among computing devices of the remote facility 204, the facility 202, and/or other computing devices, such as computing devices used by customers of an organization that utilizes the facility 202 and/or remote facility 204.

As shown in FIG. 2, in an embodiment, the facility 202 and the remote facility 204 each include one or more test machines 208, although in some embodiments, one or more test machines may be located in one of the facility 202 or remote facility 204, and not necessarily both. A test machine, in an embodiment, is any computing device operable to communicate to another computing device to provide parameters for testing a computing system, where there is a system comprising one or more computing devices. A test machine, for example, may be a desktop or notebook computer configured with executable instructions for interfacing with another computing device over a network. In an embodiment, the test machine is operable to communicate making representational state transfer (RESTful) calls to another computing device operable to receive and respond to such calls, although other protocols for communicating may be used. A test machine 208 may additionally be configured to receive information about a load being applied to a system, such as information regarding system latency, system failures, and the like. In addition, in an embodiment, a test machine 208 may be configured to perform various measurements about a system under test. As one example, a test machine 208 may send a request to a system under test during application of a load and measure the time it takes for the system to respond to the request. The test machine may similarly make a request when a load is not being applied to the system for comparison. The test machine may similarly send requests to the system while a load is applied to the system to determine if the system has failed. Generally, in various embodiments, the test machine may generally interact with a system under test in any manner that allows the test machine to measure system performance in any useful way.

In an embodiment, a test machine 208 communicates test parameters to a load generator servlet of the facility 202. The load generator servlet 202 may be a module operating on a computing device (such as a server) that is operable to receive test parameters from a test machine 208 and, in response to receipt of the test parameters, perform one or more actions in connection with performing a test on a system, such as described more fully below. A device that includes a load generator servlet may be referred to as a load generator server or in a similar manner. The load generator servlet 202 may be a servlet deployable to any device of the facility 202. The load generator servlet 202 may be operable to launch, kill, and/or monitor loads in a generic fashion, such as via a RESTful interface. In an embodiment, test machines 208 are configured to deploy load generator servlets to one or more devices of the facility 202, as appropriate for performing a test on a system of the facility 202, or a system of another facility.

As shown in FIG. 2, the load generator servlet 210 orchestrates performance of system tests through communication with one or more load drivers 212, discussed below. In an embodiment, the load generator servlet 210 defines a load in generic terms by identifying a start condition, load distribution parameters, load increase or decrease parameters, and an end condition. The start condition may include information identifying a number of transactions per second (or other time period) and/or a number of concurrent connections desired. The load distribution parameters, in an embodiment, are parameters for how a load is to be applied. The load distribution parameters may define application of the load in generic terms of actions and percentages for these actions. The actions and percentages may be specified by a user using a test machine. An application-specific load generator (load driver) may treat actions differently. For example, if the actions were CreateCommerceArea, CreateReleaseInCommerceArea, and PutConfigurationInRelease, the load distribution parameters may specify percentages for each action. As a specific example, the user may specify ten percent for CreateCommerceArea, thirty percent for CreateReleaseInCommerceArea, and sixty percent for PutConfigurationInRelease. The application specific load generator (load driver) could create random operations that respect these percentages.

The load increase or decrease parameters, in an embodiment, may be specified by a user that desires the load to vary throughout application of the load instead of being consistently applied. The load increase or decrease parameters may accordingly include information identifying an amount by which to increase or decrease the load on the system under test (in terms of transactions per second or concurrent connections), and how long between steps. Other parameters may also be specified, such as parameters for a statistical distribution of a load application such that application of the load on the system under test may be random, but generally conform to a statistical distribution characterized by the parameters.

An end condition may be specified by the user to determine when application of a load on a system under test is to cease. End conditions may be specified by a percentage of a failure rate, a time period, a number of concurrent connections, a number of transactions per second (or other time period), or, generally, in any suitable manner.

As discussed above, the load generator servlet 210 communicates with one or more load drivers 212. A load driver may be a module on a computing device that includes an interface for communication with the load generator servlet 210 and which includes logic for applying at least a portion of a load on a system, labeled as "endpoints" 214 in FIG. 2. A load driver may, for example, include logic for making Application Programming Interface (API) calls to the system under test in order to cause the system under test to perform various tasks as part of a test. A task may be any action that the system is operable to perform. Unless context clearly indicates otherwise, a load driver may also refer to a device that applies a load (or portion thereof) to a system. The tasks may be specific to one or more applications executing on the system under test, such as various tasks mentioned above. The tasks may include performing a certain number of transactions in a second (or other time period), establishing a number of concurrent connections, and/or, generally, any task that requires the system under test to utilize its computing resources (processor, storage, bandwidth, and the like). A load driver may execute on the same computing device as a load generator servlet 202, although the load driver and load generator servlet may execute on different computing devices that communicate with one another. In an embodiment, the load generator drivers 212 and load generator servlet 210 are integrated in a plug-and-play architecture that allows developers to deploy custom tests and reuse those tests, as described in more detail below.

As noted, a load generator servlet, such as the load generator servlet 210 described above, may include an interface, such as an interface 216, to allow communication by a test machine. The interface may include various functions that may be performed based on instructions from the test machine. For example, an interface of a load generator servlet may include a posting function callable by POST /loadgen/{endpoint} where "endpoint" is an identifier of a system to be tested, which may be an IP address or other identifier. The body of the call may include extensible markup language (XML) that includes a load distribution and a load definition. The load distribution may specify actions and percentages of actions. The load definition may specify a number of transactions per second. If the load is to be incremented gradually, the load definition may optionally include: a step value, which specifies an amount by which the load should increase at each increment; a time-before-step value which specifies how much time between load increases; and an end value which specifies a time or other value that indicates when incrementing should stop.

The load definition may also specify other information, which may be optional as well, including a number of concurrent connections, a minimum number of concurrent connections, a maximum number of concurrent connections, and other values. As another example, the load definition may specify a desired test period by designating a number of seconds (or other time period). In an embodiment, a user may leave a value for a desired test period empty (unspecified) if the user wishes to manually request a load stop at a later time by sending a signal to the load generator servlet or if the user wishes a strategy for the test (described below) will determine if and/or when to stop the load when a specific criterion or set of criteria is met. For instance, the user may leave a value for a desired test period empty (unspecified) in a strategy that applies a load until achieving more than twenty percent errors.

Other information that may be specified by the load definition includes, but is not limited to, whether the load is exclusive, that is, whether other loads (or loads meeting certain criteria, which may be related to load size) may be applied on the system at the same time. If the user specifies that the load is exclusive, other requests to apply load on the system may be throttled until a currently-applied load is completed. Also, the load definition may specify Put-on-queue or Fail-Fast. If Put-on-queue is specified, similar to a load balancer, if a currently-applied load is exclusive and/or if the load requested by the user is exclusive, the load generator servlet may place an identifier of the load in a queue and apply loads according to their order in the queue. The load generator servlet may calculate and return an expected time at which the load requested by the user may be applied. If Fail-Fast is specified and if a currently-applied load and/or the load requested by the user is exclusive, the load generator servlet may simply notify the user that the system is busy. Other information in addition to or alternative to the illustrative examples above may also be specified by the load definition. For example, the load definition may include Application-specific custom data such as throttling settings, caching settings, distribution of operations, data size of operations, and the like. Generally, the load definition may include any parameters for application of a load.

The interface for the load generator servlet may be configured for providing various responses to a user that uses the interface to request a load be applied to a system. For instance, the interface may be configured to provide a global user identifier (GUID) identifying a load that has been successfully started or queued. If Fail-Fast has been specified, the response may include the reason why the request to apply the load failed (such as a load already being applied). If put-on-queue has been specified, the response may specify an approximate time at which the load is scheduled to start, if the load was not started immediately. The interface may also be configured to provide other information in addition to or in alternative to that described above and, generally, may include any information that may be useful to the user.

In an embodiment, the load generator servlet interface includes other functions. For example, the load generator servlet interface may include a get function callable by GET /loadgen/. Calling GET /loadgen/ may cause the load generator servlet to provide a list of all systems on which a load may be applied. The systems available may be limited by credentials of the user. For instance, a user with certain credentials may be able to apply a load on some systems but perhaps not others. Calling GET /loadgen/{endpoint}/, where "endpoint" is an identifier of a system that the user may specify, may cause the load generator servlet to provide a list of GUIDS (or other identifiers) of all loads being applied on the identified system. Calling GET /loadgen/{endpoint}/{guid} may cause the load generator servlet to provide XML describing the load, which may be the same XML that was provided by a device of the user who initially requested the load, which may be the same or a different user. Calling GET /loadgen/{endpoint}/{guid}/status may cause the load generator servlet to provide XML describing whether the load is running and, if the load is not running, exit code and time at which it exited. If the load is running, the XML may include a start and expected end time, if such information is available, depending on the particular test being applied. Other parameters may be specified in addition to or as an alternative to the illustrative examples above and the load generator servlet may be configured to respond accordingly.

In an embodiment, the load generator servlet interface includes a put function which may be performed by calling PUT /loadgen/{endpoint}/{guid}/status, where "loadgen," "endpoint," "guid," and "status" may be as above. Use of the put function may cause the load generator servlet to send a signal to an application applying the load, that is, to send a signal to an application that is applying the load. For example, the put function may be used to kill a load (stop a load from being applied to the system). Other signals, which may be custom signals, may be sent to the load. For example, the put function may be used to change how a load is being applied by indicating to an application applying the load how to change applying the load. As a specific example, the put function may be used to indicate an increase in the amount by which a load is incrementally increased. Calling the put function may cause the load generator servlet to respond with XML, which may include information identical or similar to that which is provided by calling the get function, described above.

In addition to the above, in an embodiment, the load generator servlet interface includes a get load results function which may be callable by GET /loadgen/{endpoint}/{guid}/results, where "loadgen," "endpoint," and "guid," may be as above. Calling the get load results function may cause the load generator servlet to provide a list of operations that were performed as part of applying the load, exit values, and the like. Other functions may also be included in the load generator servlet interface, such as functions that are application specific (that is, specific to an application executing on a system being tested) and other functions. The application may be, for example, a custom application of an organization, although the application may be any application. A function of an application may be a function uniquely performed by that application, such as a function that is not generally performed in the same manner by a other applications, even applications that may be used for the same or a similar purpose. Application-specific load strategy implementation details may also be included in the load definition, as discussed more fully below in connection with FIG. 6.

Embodiments of the present disclosure utilizing the architecture described above in connection with FIG. 2 (or variations thereof) offer several advantages. For example, as discussed, conventional techniques often involve developing tests in a variety of programming languages depending on developer preferences, advantages of some languages over others, and the like. However, conventional applications for applying a load to a system are also often developed in a variety of programming languages. Thus, conventional techniques for testing a system often involve the nontrivial task of interfacing the test code with load generation code. Embodiments of the present disclosure, on the other hand, as shown in FIG. 3, provide developers a much more convenient way of developing system tests.

Figure 3:
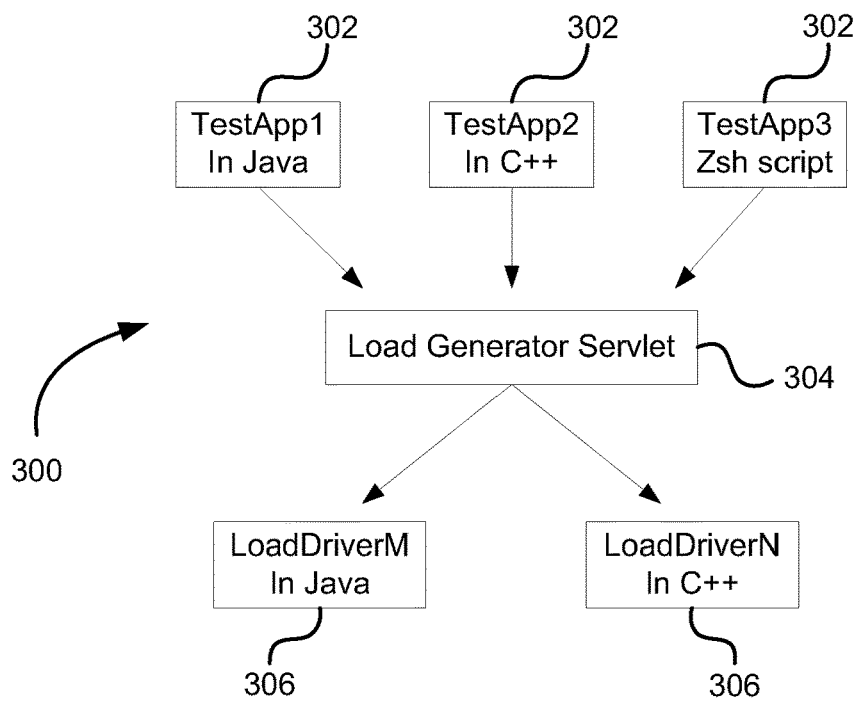
FIG. 3 shows a diagram demonstrating an embodiment of the present disclosure.

In particular, FIG. 3 shows a diagram 300 of an illustrative example of how the architecture described above in connection with FIG. 2, or variations thereof, simplifies test design and performance. As shown, the diagram 300 includes a plurality of test applications 302, a load generator servlet 304, and a plurality of load drivers 306. The test applications may include logic for performing a test on a system, as described above and may execute on one or more test machines, such as the test machines described above in connection with FIG. 2. The load generator servlet 304 and load drivers 306 may likewise be as described above.

As illustrated in FIG. 3, the test applications have been created using a plurality of different programming languages. In this example, one test application has been written in C++, another in Java, and a third in Zsh Script. Generally, a test application may be written using any programming language (or combination of languages) that is usable for interfacing with the load generator servlet 304. In an embodiment, the test applications may be written in any language that provides the ability to make RESTful calls. In this manner, because test applications are able to communicate with the load generator servlet 304 in a generic manner, embodiments of the present disclosure are programming language-agnostic. This provides developers with substantially greater freedom in designing and performing system tests.

In an embodiment, as shown in FIG. 3, performance of a test may begin with one of the test applications 302 making communication (such as a RESTful call) or series of communications to the load generator servlet 304. The communication, in an embodiment, includes parameters for a test on a subject system (a system to be tested according to the parameters of the communication). The load generator servlet 304, upon receiving the test parameters, orchestrates application of a load by one or more load drivers 306. The load drivers 306, as shown in the drawing, may include computer-executable instructions for applying a load (or part of a load) on a system. The computer-executable instructions may be created by one or more developers using Java, C++, or any suitable programming language, such as any programming language (or combination of languages) that has sufficient capability for communicating with the load generator servlet 304. In an embodiment, the load generator servlet 304 is configured with an application programming interface (API) and load drivers may be created from any language that provides the capability of utilizing the API. In this manner, code for a test on a system provided from a test machine is decoupled from code for applying a load according to the test, making tests programming language-agnostic. In other words, a developer may design a test for a system without having detailed knowledge about the programming language in which the load drivers were created. In an embodiment, users are provided the ability to test systems by providing instructions for applying a load using a command line tool from Java, Perl, a web browser, and/or a shell with a utility such as cURL.

In some instances, it is desirable to apply a load from multiple internet protocol (IP) addresses or, generally, from different devices. For example, servers of some systems are often configured to perform throttling, whereby the systems themselves impose limitations on loads that are applied. A system may, for example, limit the number of concurrent connections and/or number of transactions that may be made/performed in connection with a device of a single IP address. If the goal of a test is to determine how the system performs when loads that exceed such limitations are applied, system throttling may affect the validity of a test. As another example, large systems (such as systems involving a large number of servers) may be capable of handling loads and/or a number of concurrent connections that are larger than that which can be applied by a single device. Accordingly, FIG. 4 provides an illustrative example of a diagram 400 demonstrating how such issues may be overcome.

In an embodiment, a test application 402, such as one of the test applications described above in connection with FIG. 3, sends instructions for performing the test to load generator servlets 404 that have been deployed to multiple devices. As above, the instructions may be sent using RESTful calls or other suitable methods. The load generator servlets 404, in this embodiment, may each communicate with one or more load drivers (not shown) to collectively apply a load on a system 406 (labeled as "Endpoint M" in the figure). The load drivers may execute on the same devices on which the load generator servlets 404 have been deployed. In this manner, part of the load may be applied from one IP address while another part of the load may be applied from another IP address. For example, as shown in the figure, the load generator servlet labeled as "Load Generator Servlet 1" may be configured to cause the system under test to make a certain number of connections with a device while "Load Generator Servlet 2" may be configured to cause the system under test to make another number (which may be the same number) of connections with the another device. Similarly, "Load Generator Servlet 1" may be configured to cause the system under test to perform a certain number of transactions per second while "Load Generator Servlet 2" may be configured to cause the system under test to perform another number (which may be the same number) of transactions per second.

In addition, any of the load generator servlets involved in the same test may cause the same load to be applied to a system under test and/or different load generator servlets involved in the same test may apply different loads to the system under test. As an example, one load generator servlet may cause the system under test to repeatedly perform one type of transaction while another load generator servlet may cause the system under test to repeatedly perform another type of transaction. Generally, each load generator servlet involved in a test on a system may each apply a portion of a total load on the system under test such that the load generators, acting in concert, collectively apply a load on the system.

Figure 4:
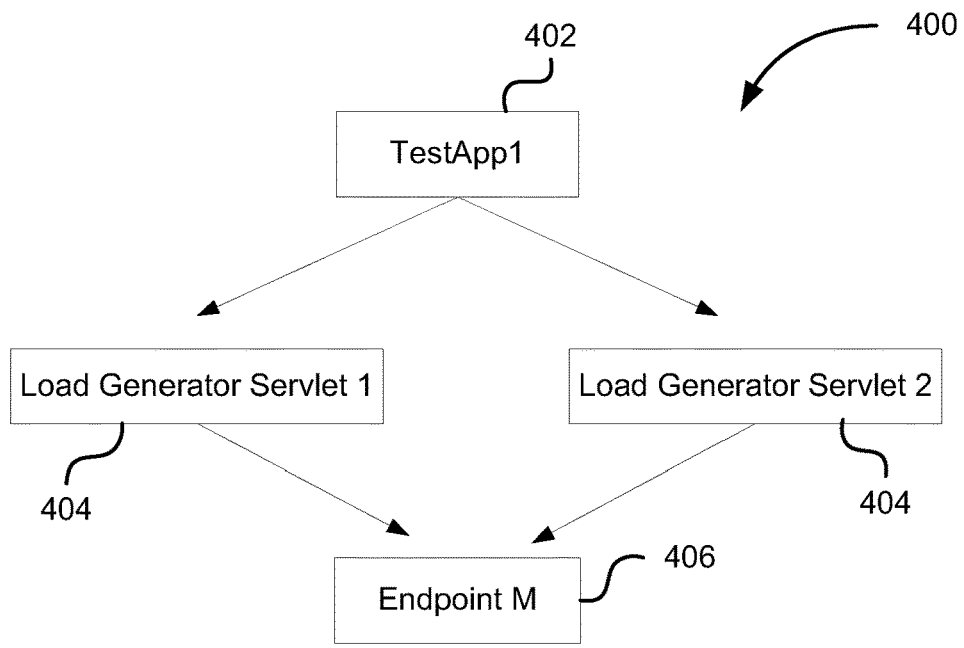
FIG. 4 shows a diagram demonstrating another embodiment of the present disclosure.

FIGS. 3 and 4 (and other figures presented herein) provide specific examples of configurations that may be used in accordance with various embodiments. These specific examples are provided for the purpose of illustration and variations and/or combinations of the embodiments illustrated in the figures are contemplated as being within the scope of the present disclosure. For example, FIG. 3 shows three test applications, a single load generator servlet, and two load drivers. Numbers of each component may vary, being less than or greater than the number of components shown in the Figure. Similarly, FIG. 4 shows a single test application, two load generator servlets, and a single endpoint while numbers of each component may also vary, being less than or greater than the number of components shown in the Figure. Additionally, any of the test applications shown in FIG. 3 may utilize multiple load generator servlets deployed on separate devices, as shown in FIG. 4. Other variations are contemplated as being within the scope of the present disclosure.

Figure 5:
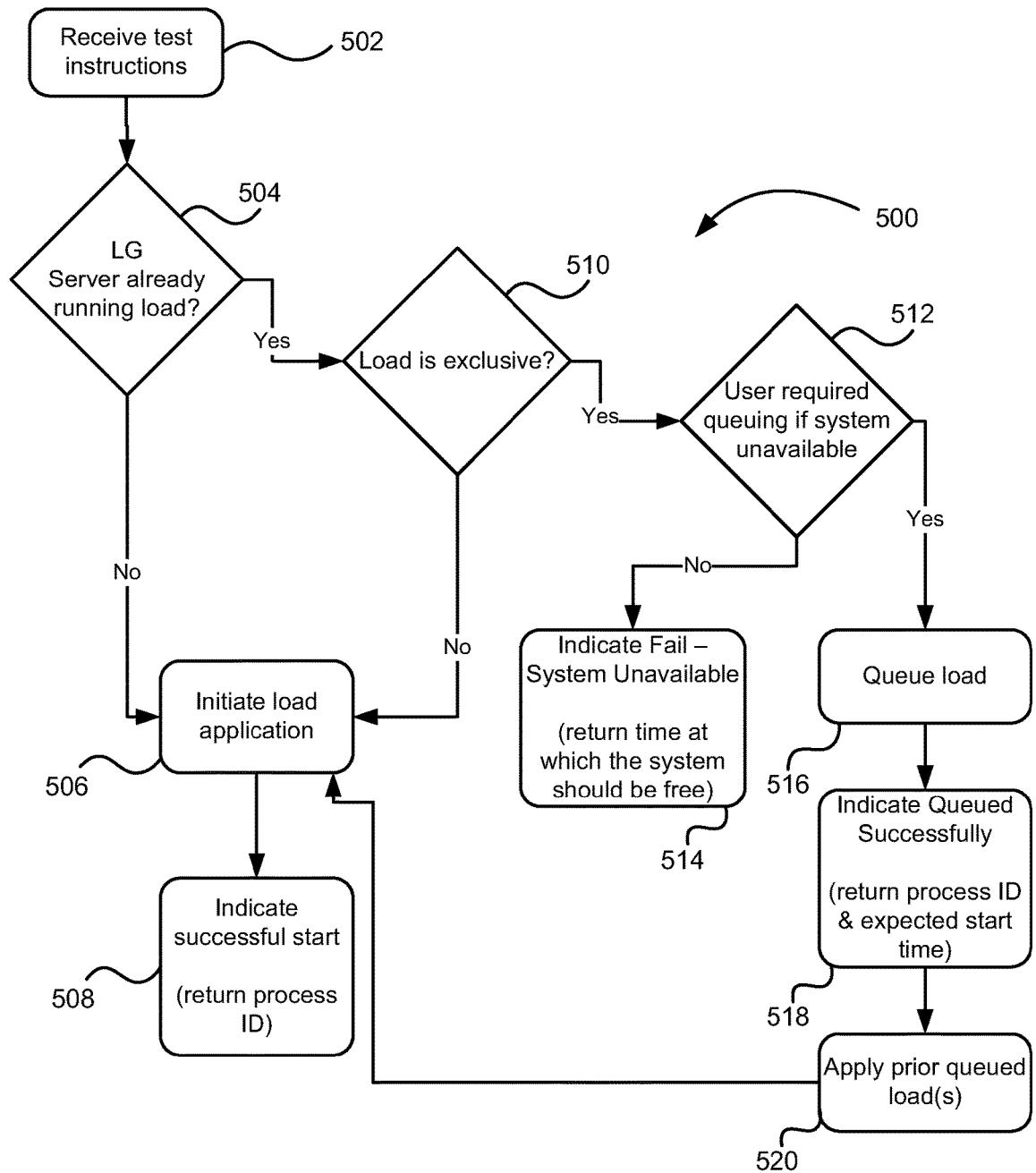
FIG. 5 shows a flowchart of an illustrative example of a process that may be used to practice various embodiments of the present disclosure.

In some cases, the existence of one or more loads being applied to a system may affect the validity of a test of the system. As an example, if two different people independently cause loads to be applied to the system as part of testing the system, the system may appear to each person to perform worse than if two loads were not being concurrently applied to the system. Unless a user realizes that another load was being applied to the system during the user's test on the system, the user may incorrectly interpret results of the test. Generally, it is often desirable to control the conditions under which a test on a system is performed. Accordingly, FIG. 5 shows an illustrative example of a process 500 that may be used in testing a system, in accordance with an embodiment. Portions of the process 500 (or any other processes described herein, or variations and/or combinations thereof) may be performed under the control of one or more computer systems configured with executable instructions and may be implemented as code (e.g., executable instructions, one or more computer programs, or one or more applications) executing collectively on one or more processors, by hardware, or combinations thereof. The code may be stored on a computer-readable storage medium, for example, in the form of a computer program comprising a plurality of instructions executable by one or more processors.

In an embodiment, instructions for performing a test are received 502. Test instructions may be received from a device, such as from one of the test machines described above in connection with FIG. 2. The instructions may be received by a device having a load generator servlet, a servlet coordinating load generator servlets, or any suitable device. In an embodiment, the instructions may include information indicating whether a load for the test is exclusive, whether a user requires queuing if the system is unavailable, and/or other parameters for a test on the system.

As used herein, a load is exclusive if it is required to be applied without another load (or without a load exceeding certain parameters) being applied to a system under test. Once the test instructions have been received, responsive to the instructions, in accordance with an embodiment, a determination is made 504 whether a server for applying the load is already running a load (i.e. applying a load to the system under test) that would preclude application of the requested load. The server may be applying the load as part of another test, as part of normal operations for the server, or otherwise.

If it is determined that the server is not already running a load, in an embodiment, application of the load is initiated 506. Initiation of the load application may include instructing a load driver to apply a load according to parameters specified by a user, such as parameters specified in instructions by a device used by the user. Generally, initiation of the load application may be any action that results in the load being applied onto the system. Once application of the load is initiated, in an embodiment, an indication that the load was successfully started is provided 508. Indication that the load was successfully started may be provided in any suitable manner, such as by dispatching an electronic message to the user. The indication that the load was successfully started may include information regarding the load, such as an identifier of the process (Process ID) that has been generated.

If, in an embodiment, it is determined that the server is, in fact, already running a load that potentially could preclude the test load, a determination is made 510 whether the requested load is exclusive. Determining whether the load is exclusive may be performed in any suitable manner, such as by analyzing parameters in the received instructions. If, in an embodiment, it is determined that the requested load is not exclusive, application of the load is initiated 510 and indication of a successful start to the load application is provided 508.

If, however, it is determined that the load is exclusive, a determination is made 512 whether the user requires queuing if the system is unavailable, that is, if the load is not to be applied immediately. As discussed above, the determination whether the user requires queuing of the load if the system is unavailable may be made in any suitable manner, such as by examining parameters specified by the user. Other ways of making the determination may also be used, such as by sending an electronic message to the user and requesting whether the user would like to queue the load.

If it is determined that the user does not require queuing if the system is unavailable, a fail condition (system unavailable) condition is indicated to the user, such as in a manner described above. Additionally, a time when the system should be free may be calculated and provided to the user. For example, if a load is currently being applied, information about the load may be used to estimate a time when the system will be free from the current load. If, however, it is determined that the user does, in fact, require queuing if the system is unavailable, the load is queued 516, in accordance with an embodiment. Queuing the load may include storing an identifier of the load with identifiers of another load in a manner that ensures that the loads will be sequentially applied or applied in another ordering which may include concurrent application of some loads in the queue.

In an embodiment, one or more loads are applied 520 according to the queue into which the requested load was queued. When loads preceding the requested load in the queue have been applied, in an embodiment, application of the initiated load is initiated 506, such as in a manner described above.

The process 500 illustrated in FIG. 5 is provided for the purpose of illustration and variations of the process 500 are considered as being within the scope of the present disclosure. For example, in certain embodiments, steps shown in FIG. 5 (or generally any process illustrated herein) may be performed in an order different from the order illustrated. As an example, a determination 506 whether the requested load is exclusive may be made prior to the determination 504 whether a server may be used to apply the load. Generally, one with skill in the art will appreciate that certain steps illustrated in the figures may be performed in an order different from that shown, that additional steps may be included, and that certain steps may be omitted.

As discussed above, embodiments of the present disclosure provide a plug-in architecture to simplify the process of designing and performing system tests. In an embodiment, users are able to design tests by requesting various load strategies, where a strategy includes instructions for performing at least part of a test. Users designing tests can utilize available strategies or, if no suitable and/or optimal strategy is available, users may design their own strategies. A strategy may be a stand-alone application that provides the ability to parse load request parameters from a command line, the ability to receive a kill signal from the operating system to abort operation, and the ability to save results to a file. Libraries may be provided to support these tasks.

Figure 6:
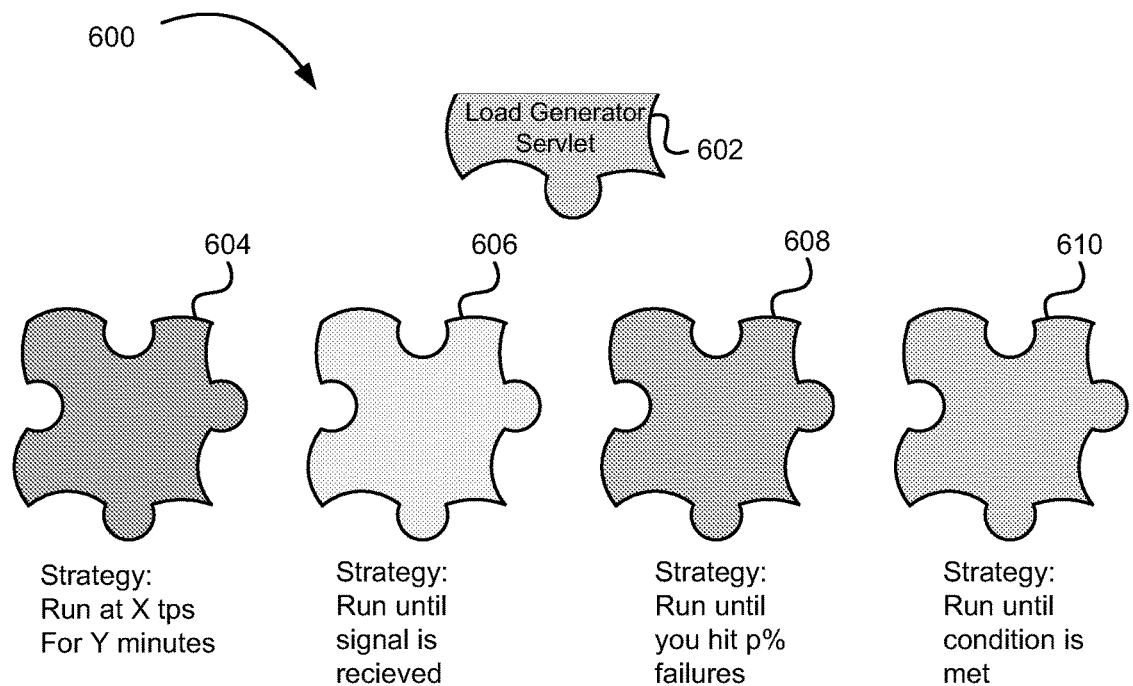
FIG. 6 shows a diagram demonstrating a relationship between a load generator servlet and plug-in strategies, in accordance with an embodiment.

FIG. 6, accordingly, provides an illustrative example of a diagram 600 that demonstrates one way in which the plug-in architecture may be utilized. In an embodiment, a load generator servlet 602 is configured with an API that allows developers to design various strategies. In an embodiment, strategies may be written in any programming language that provides the capability of utilizing the API of the load generator servlet 602. As an example of a strategy, FIG. 6 illustrates a strategy 604 for applying a load such that the system under test performs X transactions per second for Y minutes, where X and Y are variables that may be specified by a user when specifying instructions to perform a test. A user designing a test may utilize the strategy by specifying values for X and Y and perhaps by specifying a particular transaction to be performed, which may be specific to an application executing on a system being tested. Thus, instead of having to define the logic for a test that utilizes the strategy for each system being tested, users can take advantage of strategies that are applicable to the tests the users intend to perform. However, as noted, if a suitable strategy does not exist, developers can design a strategy, utilizing the API of the servlet, as appropriate. Multiple servlets may utilize the same API to allow use of strategies with multiple servlets.

FIG. 6 also illustrates other strategies which may be used as part of a test—for example, a strategy 606 for performing an action until a signal is received. Users utilizing the strategy 606 may specify the action and the signal that will trigger stopping performance of the action. The strategy 606 may be used, for example, in a test that sequentially increases the load on a system until a signal, such as a signal indicating a system failure, is received. In this example, performing the action would be increasing the load on a system a certain amount. As another example, a strategy 608 is for performing an action until p percent of the attempts at performing the action is achieved, where p is a variable that a user utilizing the strategy may specify. As with the strategy 606, the strategy may be used, for instance, in a test that sequentially increases the load until a specified percentage of system failures is achieved. System failures may be, for instance, failure to respond to a request sent to the system as part of a test, failure to perform an action in a specified time period, and the like. FIG. 6 also includes a more general strategy 610 which is for performing an action until a condition is met. With the strategy 610, users may specify the action and the condition.

Of course, the strategies provided in FIG. 6 are provided for the purpose of illustration and other strategies may be available and/or developed, including variations of the strategies shown. In addition, an action in a strategy may comprise multiple sub-actions and strategies may be simpler or more complex than shown. Generally, a strategy may be any set of instructions that, when executed according to a test utilizing the strategy, cause a system under test to perform one or more actions. Further, a test may utilize a single strategy or may utilize multiple strategies. Multiple strategies for a test may be useful, for example, when the test involves complex loads on a system under test, such as loads causing the system to perform multiple types of actions. Also, in an embodiment, the plug-in architecture utilized by various embodiments of the present disclosure may include one or more templates to enable users to compose strategies that follow the general structure of a strategy.

As noted above, embodiments of the present disclosure allow for substantial flexibility in designing tests on systems. Also noted, Java may be used in various aspects of implementation of various embodiments. For applying a load in Java, an executor service may be created. The executor service may be a max thread pool given the user-requested value for max-concurrent-connections. In this manner, the load may be controlled to never exceed that number of maximum concurrent connections. This may be useful when a server of a system being tested is known to throttle or surge-queue connections past a certain number of max connections and it is undesirable for requests to go into a surge queue. Accordingly, this executor service may handle each transaction as a separate thread according to ExecutorService executor=Executors.newFixedThreadPool (maxConcurrentConns).

To achieve a certain number of transactions per second (TPS), there may be a scheduler thread independent from the worker thread pool that places the transaction requests on the worker thread pool at a delay step provided in nanoseconds by dividing the number of nanoseconds in one second by the desired Transactions-per-Second. The scheduler service may be defined as:

ScheduledExecutorService
   scheduler=Executors.newScheduledThreadPool(1);
Scheduler.scheduleAtFixedRate( . . . )

In some instances, a requirement for a load is that it must be able to run (be applied) for an indeterminate amount of time. Accordingly, application-specific load generators may be prevented from keeping any particular piece of the operation information in memory post the end of the transaction. This may be accomplished by attaching an Observer to the transaction, where any strategy may be injected at runtime via the Spring Framework for the Java platform. The observer may get an update at the conclusion of every transaction, before clearing out the memory used for it, and it may choose to save whatever data the user is interested in saving. Some common Observers may be Flush-to-Disk, Keep-in-Memory (for small runs where the input/output (I/O) overhead of writing to disk is undesirable), or Observers that simply keep track of statistics. For example, an Observer that keeps track of statistics may be used when testing throttling behavior, and the Observer may count how many transactions were conducted and how many of these returned throttling return codes.

In an embodiment, an application-specific load generator is free to interpret Actions and Percentages of Actions in a manner appropriate to the application. A random distribution may be tailored to meet these percentages, such as in a manner described above. When an operation requires data from another operation—for example, a user may need to use a put function prior to using a get function—the operations that need additional data may be put on hold until the data is available. When the operations that provide the data finish, they may post the data to a common memory location, and the users can select random available data to conduct the operation requested.

Figure 7:
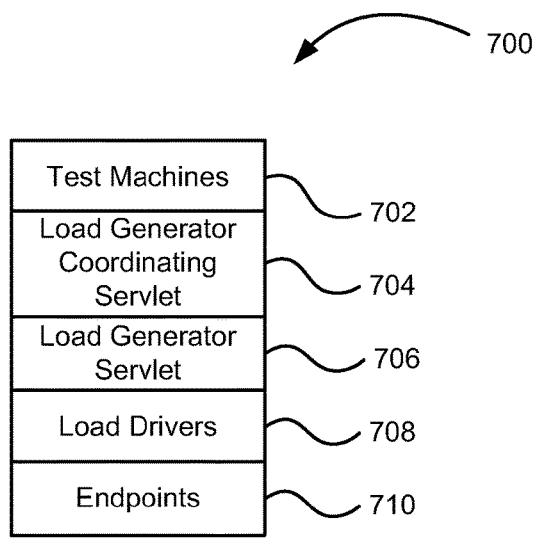
FIG. 7 shows an architectural diagram of an architecture that may be used to practice various embodiments of the present disclosure.

As noted, embodiments of the present disclosure provide an advantageous architecture for developers wherein users are able to perform tests where devices applying a load as part of a test are decoupled from a testing device. Users may utilize various embodiments of the present disclosure to, for instance, perform a test on a system where the user and/or a device for administering the test are geographically remote from the system. In some instances, it may be desirable for a user to be able to perform tests on systems located in various geographical locations and/or on systems having subsystems located in various geographical locations. FIG. 7 provides an illustrative example of an diagram 700 of an architecture that can be used to facilitate such tests, although the architecture may be useful in other situations, including some described above.

As in FIG. 2, the architecture 700 illustrated in FIG. 7 is described in terms of multiple architectural layers. For example, as illustrated in FIG. 7, the architecture 700 includes a layer 702 comprising one or more test machines. The test machines may be any devices capable of administering a test, such as the test machines described above in connection with FIG. 2. In an embodiment, each of the test machines communicates instructions for performing a test with one or more load generator coordinating servlets 704. A load generator coordinating servlet 704 may be a module executing on a device, such as a server, that is operable to dispatch instructions to one or more load generator servlets 706. The one or more load generator servlets 706 may be as above. A load generator coordinating servlet may be part of the same device as one or more of the load generator servlets, or may be separate. The one or more load generator servlets 706 may communicate with one or more load drivers 708 to apply a load on one or more systems 710 as part of a test. The load generator servlet(s), load driver(s), and system(s) may interact with one another consistent with the above disclosure.

As an example of how the architecture 700 may be utilized by a user to perform a test on a system, a user may, through a test machine, provide instructions for performing a test on the system. The load generator coordinating servlet may select an appropriate load generator servlet and dispatch instructions for applying a load to the load generator servlet. For instance, if the user is part of an organization that utilizes multiple data centers as part of its operations, the load generator coordinating servlet may dispatch instructions for applying the load to a load generator servlet located in a data center containing the system to be tested. If the test includes multiple data centers, the load-generating coordinating servlet may dispatch instructions to multiple load generator servlets, each located in a different data center.

Variations of the architecture 700 are considered within the scope of the present disclosure. For example, as described above, various embodiments do not include a load generator coordinating servlet. In addition, additional layers of servlets may be included in various embodiments. For instance, a servlet in a data center may coordinate the actions of multiple devices in the data center in order to cause the multiple devices to collectively apply a load on a system.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method, comprising:
   providing, at a bad generator server, an interface to accept test requests from a plurality of test administration devices;

19 receiving, at the interface of the bad generator server from a particular remote test administration device of the plurality of test administration devices, an instruction to perform a test on at least one system in a data center, the data center including one or more application-specific load generators and the load generator server;

extracting, from the instruction by the load generator server, using one or more computers of the load generator server, one or more parameters for applying a test load, the one or more parameters specifying at least one of: a target number of transactions in a time period or a target number of concurrent connections;

sending, by the load generator server to one or more application-specific load generators, generic instructions based on the extracted parameters;

translating, by the one or more application-specific load generators, the generic instructions to application-specific instructions;

applying a test load, wherein applying the test load comprises sending the application-specific instructions to the at least one system in the data center;

causing the at least one system to perform one or more actions according to the application-specific instructions;

detecting results of applying the test load during said applying the test load; and in response to determining that one or more conditions for the test have been met, providing, by the load generator server to the test administration device via the interface, one or more results of the test.

2. The method of claim 1, wherein the particular remote test administration device is located at a geographic location different from a geographic location of the data center.

3. The method of claim 1, wherein receiving the instruction comprises receiving an asynchronous instruction that corresponds to a web service call.

4. The method of claim 1, wherein determining that the one or more conditions have been met comprises determining that the test has been successfully completed.

5. The method of claim 1, wherein providing the one or more results comprises providing one or more latency values or providing a number of error messages.

6. The method of claim 1, wherein the one or more parameters further specify whether the test load is an exclusive load, and, in response to the one or more parameters specifying that the test load is an exclusive load, further comprising determining whether another test load is already being applied to the at least one system prior to instructing the particular application-specific load generator to apply the exclusive load.

7. A method, comprising:
providing, at a load generator server using one or more computers of the load generator server, an interface to accept test requests from a plurality of test administration devices;

receiving, at the interface of the load generator server from a test administration device, an instruction to perform a test on a subject system, the test administration device being separate from the subject system and from a plurality of load-generating applications;

extracting, from the instruction by the load generator server, one or more parameters for performing the test, wherein the one or more parameters specify whether the one or more test loads include an exclusive load;

based at least in part on determining that another test load is not being applied to the subject system,

20 instructing, by the load generator server, a particular load-generating application of the plurality of load-generating applications to apply one or more test loads to the subject system based at least in part on the one or more parameters; and measuring, by the test administration device, one or more effects of applying the one or more test loads on the subject system while the one or more test loads are applied to the subject system.

8. The method of claim 7, wherein the one or more parameters further specify at least one of concurrent connections to the subject system or a number of transactions during a time period.

9. The method of claim 7, wherein monitoring the subject system comprises receiving one or more test results from the subject system via a local connection of a common facility that includes the load generator server and the subject system.

10. The method of claim 7, wherein instructing the particular load-generating application to apply the one or more test loads comprises instructing the particular load-generating application to cause the subject system to perform at least one action that is specific to an application executing on the subject system.

11. A system, comprising:
one or more load generators, wherein each of the one or more load generators is configured to apply a test load on a subject system;

one or more load generator servers comprising one or more respective interfaces, wherein the one or more load generator servers are configured to:
receive, by at least one respective interface from a particular test administration device, test administration instructions, wherein the test administration instructions specify whether the one or more test loads include an exclusive load; and
determine whether another test load is being applied to the subject system;
for a determination that another test load is not being applied to the subject system,
cause a particular load generator of the one or more load generators to apply at least a portion of the test load on the subject system based at least in part on the test administration instructions;
for a determination that another test load is being applied to the subject system, queue or otherwise delay the exclusive test load; and the particular test administration device, wherein the particular test administration device is separate from the one or more load generators and from the subject system, and wherein the particular test administration device is configured to:
send the test administration instructions to the one or more load generator servers;
measure one or more effects of applying the test load on the subject system.

12. The system of claim 11, wherein the test administration instructions specify a number of transactions per a time period for the test load.

13. The system of claim 11, wherein the test administration instructions specify a number of concurrent connections to the subject system for the test load.

14. The system of claim 11, wherein the one or more load generator servers include a plurality of load generator servers configured to communicate with respective load generators of the one or more load generators such that the respective load generators collectively apply the test load on the subject system.

15. The system of claim 14, wherein the respective load generators are configured, responsive to the communications from the plurality of load generator servers, to apply respective portions of the test load from respective network addresses.

16. One or more non-transitory computer-readable storage media having collectively stored thereon instructions that, when executed by one or more computers of a computer system, cause the computer system to at least:
   provide, a servlet of a testing system, the servlet being configured to receive, at an interface of the servlet, test requests from a plurality of testing computing devices that are separate from the testing system;
   provide one or more application-specific load generators of the testing system;
   receive, at the interface of the servlet from a particular testing computing device of the plurality of testing computing devices, a particular test request comprising parameters for applying one or more test loads on a subject system, wherein the one or more parameters specify whether the one or more test loads include an exclusive load;
   determine whether another test load is not being applied to the subject system;
   for a determination that another test load is not being applied to the subject system, instruct, by the servlet based at least in part on the parameters, a particular application-specific load generator of the one or more application-specific load generators to apply at least a portion of the one or more test loads to the subject system;
   for a determination that another test load is being applied to the subject system, queue or otherwise delay the exclusive test load; and
   receive, at the servlet, results of applying the one or more test loads to the subject system.

17. The one or more non-transitory computer-readable storage media of claim 16, wherein to receive the particular test request the instructions are executed to cause the computer system to receive a web service call.

18. The one or more non-transitory computer-readable storage media of claim 16, wherein the instructions, when executed by the one or more computers, further cause the computer system to instruct a different application-specific load generator of the one or more application-specific load generators to apply a different portion of the one or more test loads.

19. The one or more non-transitory computer-readable storage media of claim 18, wherein the particular application-specific load generator and the different application-specific load generator have different internet protocol (IP) addresses.

20. The one or more non-transitory computer-readable storage media of claim 16, wherein the instructions, when executed by the one or more computers, further cause the computer system to provide, from the particular application-specific load generator, the at least a portion of the test load to the subject system via a local connection of a common facility that includes the particular application-specific load generator and the subject system.

21. The one or more non-transitory computer-readable storage media of claim 16, wherein the instructions, when executed by the one or more computers, further cause the computer system to, in response to the parameters specifying that a particular test load of the at least a portion of the one or more test loads is an exclusive load, determine whether another test load is already being applied to the subject system prior to instructing the particular application-specific load generator to apply the at least a portion of the one or more test loads.

22. A method, comprising:
   providing, at a servlet of a testing system in a data center that includes one or more application-specific load generators, an interface to accept test requests from a plurality of testing computing devices that are separate from the testing system;
   receiving, at the interface of the servlet from a particular testing computing device of the plurality of testing computing devices, parameters for applying one or more test loads on a subject system in the data center;
   sending, by the servlet to the one or more application-specific load generators, generic instructions based on the extracted parameters;
   translating, by the one or more application-specific load generators, the generic instructions to application-specific instructions;
   applying, by the one or more application-specific load generators, a test load, wherein applying the test load comprises sending the application-specific instructions to the subject that at least one system in the data center;
   causing the subject system to perform one or more actions according to the application-specific instructions; and
   receiving results of applying the one or more test loads to the subject system.

23. The method of claim 22, wherein receiving the parameters comprises receiving one or more web service calls.

24. The method of claim 22, further comprising, in response to the parameters, instructing, using the one or more computers of the servlet, a different application-specific load generator to apply a different portion of the one or more test loads to the subject system.

25. The method of claim 22, wherein the one or more application-specific load generators include a plurality of application-specific load generators that have different respective internet protocol (IP) addresses.

26. The method of claim 22, wherein instructing the particular application-specific load generator comprises communicating with a common facility that includes the particular application-specific load generator, and wherein receiving the results comprises communicating with the common facility that includes the subject system.

27. The method of claim 22, wherein the parameters further specify whether at least one load of the one or more test loads is an exclusive load and, in response to the parameters specifying that at least one load is an exclusive load, further comprising determining whether another load is already being applied to the subject system prior to instructing the particular application-specific load generator to apply the exclusive load.

* * * * *